(12) United States Patent
Hague et al.

(10) Patent No.: US 10,840,894 B1
(45) Date of Patent: Nov. 17, 2020

(54) LINEAR DELAY GENERATION CIRCUITRY AND METHOD

(71) Applicant: Dialog Semiconductor (UK) Limited, London (GB)

(72) Inventors: Gary Hague, Swindon (GB); Rupert Howes, Stroud (GB); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/535,230

(22) Filed: Aug. 8, 2019

(30) Foreign Application Priority Data

May 29, 2019 (DE) ......................... 10 2019 207 959

(51) Int. Cl.
*H03K 5/133* (2014.01)
*H03M 1/66* (2006.01)
*H03K 5/00* (2006.01)

(52) U.S. Cl.
CPC .............. *H03K 5/133* (2013.01); *H03M 1/66* (2013.01); *H03K 2005/00019* (2013.01)

(58) Field of Classification Search
CPC ................................. H03M 1/66; H03K 5/133
USPC .................................................. 341/140–160
See application file for complete search history.

(56) References Cited

U.S. PATENT DOCUMENTS

| | | | | |
|---|---|---|---|---|
| 6,037,812 A * | 3/2000 | Gaudet | ...................... | H03L 7/07 327/116 |
| 6,088,415 A * | 7/2000 | Gaudet | ................. | H04L 7/0331 327/170 |
| 6,531,974 B1 * | 3/2003 | Callahan | ................ | H03K 5/131 341/120 |
| 6,744,649 B1 * | 6/2004 | Yang | .................... | H02M 3/3376 363/98 |
| 10,164,531 B2 * | 12/2018 | Acar | ........................ | H02M 1/38 |
| 2005/0140422 A1 * | 6/2005 | Klemmer | .................. | H03F 1/30 327/337 |

(Continued)

FOREIGN PATENT DOCUMENTS

| DE | 42 35 317 | 5/1993 |
|---|---|---|
| DE | 101 64 822 | 4/2007 |

OTHER PUBLICATIONS

"A Digitally Programmable Delay Element: Design and Analysis," by Mohammad Maymandi-Nejad et al., IEEE Transactions on Very Large Scale Integration (VLSI) Systems (vol. 11, Issue: 5, Oct. 2003), pp. 871-878.

(Continued)

*Primary Examiner* — Lam T Mai
(74) *Attorney, Agent, or Firm* — Saile Ackerman LLC; Stephen B. Ackerman

(57) ABSTRACT

The present document discloses a circuitry for delaying a digital input signal. In particular, the circuitry may comprise a delay cell circuit and a reciprocal current digital-to-analog converter (DAC). The delay cell circuit may be coupled to the reciprocal current DAC. More particularly, the reciprocal current DAC may be configured to output a charge current to the delay cell circuit according to a value of a control input provided to the reciprocal current DAC. The charge current output by the reciprocal current DAC may be inversely proportional to the value of the control input, wherein the delay depends on the charge current.

30 Claims, 8 Drawing Sheets

(56) References Cited

U.S. PATENT DOCUMENTS

2010/0019795 A1* 1/2010 Suda .................. G01R 31/3016
324/754.07
2017/0315578 A1* 11/2017 Lin ........................ G05F 3/262

OTHER PUBLICATIONS

"A Variable Delay Line PLL for CPU-Coprocessor Synchronization," by Mark G. Johnson et al., IEEE Journal of Solid-State Circuits, vol. 23, No. 5, Oct. 1988, pp. 1218-1223.
"Digitally Controllable Delay Element Using Switched-Current Mirror," by Sekedi B. Kobenge et al., WSEAS Transactions on Circuits and Systems, Issue 7, vol. 8, Jul. 2009, pp. 599-608.
German Office Action, File No. 10 2019 207 959.8, Applicant: Dialog Semiconductor (UK), dated Mar. 20, 2020.

* cited by examiner

LINEAR DELAY GENERATION CIRCUITRY AND METHOD

TECHNICAL FIELD

The present document relates to linear delay generation. In particular, the present document relates to generation of a digital signal delay, which is linearly dependent on an input control vector.

BACKGROUND

In general, a circuit that can generate a delayed version of an input signal (e.g., digital input signal) may find wide use in generation of a pulse-width modulation (PWM) signal in control loops among various applications.

Conventional circuits for generating a delay for a digital input signal typically involve altering different circuit parameters in order to tune the delay to the required value. However, these conventional methods typically exhibit respective drawbacks and/or disadvantages.

For example, one method may involve modifying the capacitance of the circuit such as by putting a shunt capacitor in the digital signal path. However, in such method, for supporting a large number of different delay settings also a large number capacitors would be required, and would need to match with the respective delay settings. This large number of capacitors would then occupy a large area. By way of example, an 8-bit delay control may then require in total of 255 unit capacitors.

An alternative method may involve modifying the switching threshold (e.g., a reference voltage to be used in a comparator). However, in such method, the generation of a linear delay would require the reference voltage also to change linearly. For fast control loops, a fast changing reference voltage may be excessively power hungry and large in area.

A further alternative may involve modifying the current such as by using current-starved inverter-based delay elements. However, in such method, either a linear relationship between control vector and delay cannot be easily achieved in practice, or the performance may not be acceptable.

These conventional methods may also suffer from large power consumption and dependence on process, voltage and temperature (PVT).

SUMMARY

In view of some or all of the above problems, the present disclosure proposes circuitry and methods for delaying a digital input signal, having the features of the respective independent claims. Generally speaking, the term "delay" means that the output signal has a value/amplitude proportional to that of the input signal (e.g., the same value/amplitude as the input signal) but at later (delayed) time instances.

An aspect of the disclosure relates to circuitry for delaying a digital input signal. In particular, the circuitry may comprise a delay cell circuit and a reciprocal current digital-to-analog converter (DAC). The term "reciprocal" generally means that the output current of the DAC is inversely proportional to the input of the DAC. The delay cell circuit, or simply referred to as the delay cell, may be coupled to the reciprocal current DAC. More particularly, the reciprocal current DAC may be configured to output a charge current to the delay cell circuit, according to a value of a control input provided to the reciprocal current DAC. The control input may in some cases be referred to as a (digital) control vector comprising for example N (input) bits, wherein N is an integer larger than or equal to 1. As will be understood and appreciated by the skilled person, the number N may be chosen (determined) depending on different circumstances and/or requirements, such as the maximum delay required, etc. By way of example, if N equals to 8 (i.e., an 8-bit control vector), it means that the input value provided to the reciprocal current DAC may be any one value from 0 (i.e., all 8 bits set to 0) to 255 (i.e., all 8 bits set to 1). The charge current output by the reciprocal current DAC may be inversely proportional to the value of the control input. That is to say, when the value of the control input increases, at the same time the charge current output by the reciprocal current DAC also decreases, particularly in an inversely proportional (reciprocal) manner. The delay cell may be configured to generate a delayed digital output signal of the digital input signal. In particular, the delay, or in other words the time period for which the digital output signal is delayed with respect to the digital input signal, may depend on the charge current.

Configured as proposed, a delay of the digital input signal can be generated (achieved) that is linearly proportional to the value of the control input (control vector). That is to say, by increasing (or decreasing) the value (magnitude) of the control vector, the delay between the digital input signal and the digital output signal also increases (or decreases) in a linearly proportional manner.

In some embodiments, the circuitry may further comprise a bias circuit. The bias circuit may be coupled to the reciprocal current DAC. In particular, the bias circuit may be used (configured) for generating a bias current for the reciprocal current DAC. As will be appreciated by the skilled person, in some cases, the generated bias current may be understood as a current that the bias circuit would like to drain (sink) from the reciprocal current DAC to the bias circuit. The circuitry may yet further comprise a feedback circuit coupled to the bias circuit. The feedback circuit may be used for generating an operating voltage based on the bias current. In particular, the operating voltage may be used for controlling (operating) the reciprocal current DAC. As will be appreciated by the skilled person, the feedback circuit may be implemented as a feedback loop coupled between an output of the reciprocal current DAC and an input of the reciprocal current DAC.

In some embodiments, the feedback circuit may comprise an amplification circuit. The amplification circuit may be used for generating the operating voltage that is used for controlling (operating) the reciprocal current DAC. In some cases, the amplification circuit may be implemented as simple as an amplifier. However, other suitable implementations of the amplification circuit may also be applied, as will be appreciated by the skilled person.

In some embodiments, the generation of the operating voltage may comprise (a step of) comparing the bias current to a current that depends on the charge current. Correspondingly, the operating voltage may be generated based on a result of the comparison. As will be understood and appreciated by the skilled person, the (actual) current drained from the reciprocal current DAC may vary (increase or decrease) depending on circumstances (e.g., a change in the value of the control input, a change in the configuration of the reciprocal current DAC, etc.), and thus may be larger or less than the (desired) bias current. Consequently, this difference would result in a change (increasing or decreasing) of the operating voltage of the reciprocal current DAC through the presence of the feedback circuit, in order to regulate the current back to the desired value.

In some embodiments, the reciprocal current DAC may comprise a plurality of first transistor devices and a second transistor device. In particular, the second transistor device may be coupled between a supply voltage (e.g., VDD) and the delay cell circuit. On the other hand, each one of the plurality of first transistor devices is selectively switchable to be coupled between the supply voltage and the bias circuit and to have a common gate with the second transistor device. The term "common gate" generally means that the respective gates of the selected number of first transistor devices and the gate of the second transistor devices are (directly) connected together. As such, a configurable number of first transistor devices can be selected to be coupled between the supply voltage and the bias circuit. In some cases, the plurality of first transistor devices may be coupled in parallel with each other. However, other suitable interconnections among the plurality of first transistor devices may be applied (used) as will be appreciated by the skilled person, as long as each one of the plurality of first transistor devices can be selectively switchable to be coupled between the supply voltage and the bias circuit and to have a common gate with the second transistor device.

In some embodiments, the configurable number of first transistor devices is determined based on the value of the control input. In other words, depending on a particular value of the control input (for generating a corresponding particular delay), a corresponding particular configurable number of the first transistor devices can be selected (enabled) to be coupled between the supply voltage and the bias circuit.

In some embodiments, the operating voltage generated by the feedback circuit may be supplied to the common gate of the selected (configurable) number of first transistor devices and the second transistor device.

In some embodiments, the reciprocal current DAC may further comprise a third transistor device coupled in parallel with the plurality of first transistor devices between the supply voltage and the bias circuit. In particular, the third transistor device may also share the common gate with the configurable number of first transistor devices and the second transistor device. That is to say, the gate of the third transistor device may be connected to the common gate of the configurable number of first transistor devices and the second transistor device.

In some embodiments, the delay cell circuit may comprise a capacitive element. The capacitive element may be implemented as simple as a capacitor or as any other suitable element, as will be appreciated by the skilled person. The capacitive element may be coupled between the reciprocal current DAC and a predetermined voltage level. The predetermined voltage level may for example be VSS, ground (GND) or any other suitable reference voltage level. Configured as such, the capacitive element can be charged by the charge current, for generating a charge voltage at an intermediate node based on a charge of the capacitive element. The delay cell circuit may further comprise a comparator coupled to the intermediate node. The comparator may be used for generating the delayed digital output signal based on a comparison between the charge voltage and a reference voltage.

In some embodiments, the delay cell circuit may further comprise a switch arrangement (with one or more switching devices). The switch arrangement may be configured to couple the capacitive element to the charge current upon a rising flank (rising edge) or a falling flank (falling edge) of the input digital signal. That is to say, depending on the configuration of the switching arrangement, the rising edge or the falling edge (or even both edges in some cases) can be delayed as desired.

In some embodiments, the switch arrangement may comprise a first switching device and a second switching device. In particular, the first switching device may be coupled between the reciprocal current DAC and the intermediate node. The first switching device may be used for coupling the capacitive element to the charge current during an ON state (conductive state) of the first switching device. In this case, the capacitive element may be charged by the charge current and correspondingly generate the charge voltage at the intermediated node. As will be appreciated by the skilled person, the value of the charge voltage may vary (increase) and is dependent on the charging process of the capacitive element. On the other hand, the second switching device may be coupled in parallel with the capacitive element between the intermediate node and the predetermined voltage level. The second switching device may be used for decoupling the capacitive element from the charge current during an ON state of the second switching device. In this case, the capacitive element may be (gradually) discharged to zero. In order to properly charge and discharge the capacitive element for generating the delayed output digital signal, the first and second switching devices are switched to the respective ON state in a mutually exclusive (complementary) manner based on the input digital signal. That is to say, depending on the value (amplitude) of the input digital signal, only one of the first switching device and the second switching is in the ON state and the other is in an OFF state (non-conductive state).

In some embodiments, the switch arrangement may further comprise a third switching device coupled between the reciprocal current DAC and the predetermined voltage level. In particular, the third switching device may be switched to its ON state in conjunction with the second switching device. In other words, the third switching device may be switched to the ON state at the same time as the second switching device, complementary to that of the first switching device.

In some embodiments, the bias current may be generated based on the same reference voltage as used by the delay cell circuit. That is to say, the same reference voltage used in the delay cell circuit (e.g., in the comparator of the delay cell) may be used also for the bias circuit. Configured as such, the delay may be generated in a way that is independent of the variation in the reference voltage. In particular, the feedback circuit (or the amplification circuit of the feedback circuit) may sense the output of the bias circuit and adjust (control) the reciprocal current DAC in accordance with the variations in the reference voltage.

In some embodiments, the bias circuit may comprise a fourth transistor device. The fourth transistor device may be controlled by a reference voltage. In particular, the same reference voltage used in the delay cell circuit may be used to operate (control) the fourth switching device of the bias circuit. Configured as such, the delay may be generated in a way that is independent of the variation in the reference voltage. Notably, the first through fourth switching devices may be implemented using for example a MOSFET or any other suitable manner, as will be appreciated by the skilled person.

In some embodiments, all of the above mentioned transistor devices (i.e., the first through the fourth transistor devices) may be of the same transistor type. That is to say, the transistor devices may be implemented using the same type of transistors (e.g., NPN or PNP transistors). Configured as such, the delay may be generated in a way that is independent of the variation in the process (in the implementation of the transistors).

Similarly, in order to generate a delay in a way that is independent of the variation in the temperature, the charge current may be chosen to have a zero temperature coefficient.

Configured as such, the circuitry for delay generation may be implemented to be independent of process, voltage and temperature (PVT).

Another aspect of the disclosure relates to a method for delaying a digital input signal of a circuitry. The circuitry may be implemented according to the above illustration. In particular, the circuitry may comprise a delay cell circuit and a reciprocal current digital-to-analog converter (DAC). The term "reciprocal" generally means that the output current of the DAC is inversely proportion to the input of the DAC. The delay cell circuit, or simply referred to as the delay cell may be coupled to the reciprocal current DAC. Correspondingly, the method may comprise a step of outputting, by the reciprocal current DAC, a charge current to the delay cell circuit according to a value of a control input. The control input may in some cases be referred to as a (digital) control vector comprising for example N (input) bits, wherein N is an integer larger than or equal to 1. As will be understood and appreciated by the skilled person, the number N may be chosen (determined) depending on different circumstances and/or requirements, such as the maximum delay required, etc. By way of example, if N equals to 8 (i.e., an 8-bit control vector), it means that the input value provided to the reciprocal current may be any one value from 0 (i.e., all 8 bits set to 0) to 255 (i.e., all 8 bits set to 1). More particularly, the charge current may be inversely proportional to the value of the control input. That is to say, when the value of the control input increases, at the same time the charge current output by the reciprocal current DAC also decreases particularly in an inversely proportional (reciprocal) manner. The method may further comprise a step of generating, by the delay cell circuit, a delayed digital output signal of the digital input signal. More particularly, the generated delay, or in other words the time period for which the digital output signal is delayed with respect to the digital input signal, may depend on the charge current.

In some embodiments, the circuitry may further comprise a bias circuit coupled the reciprocal current DAC and a feedback circuit coupled to the bias circuit. Correspondingly, the method may further comprise generating, by the bias circuit, a bias current for the reciprocal current DAC. As will be appreciated by the skilled person, in some cases, the generated bias current may be understood as a current that the bias circuit would like to drain (sink) from the reciprocal current DAC to the bias circuit. The method may yet further comprise generated an operating voltage based on the bias current and controlling (operating) the reciprocal current DAC using the operating voltage. As will be appreciated by the skilled person, the feedback circuit may be implemented as a feedback loop coupled between an output of the reciprocal current DAC and an input of the reciprocal current DAC.

In some embodiments, the feedback circuit may comprise an amplification circuit. The amplification circuit may be used for generating the operating voltage that is used for the controlling (operation) of the reciprocal current DAC. In some cases, the amplification circuit may be implemented as simple as an amplifier. However, other suitable implementations of the amplification circuit may also be applied, as will be appreciated by the skilled person.

In some embodiments, the generation of the operating voltage may comprise a step of comparing the bias current to a current that depends on the charge current and the operating voltage may be generated based on a result of the comparison. As will be understood and appreciated by the skilled person, the (actual) current drained from the reciprocal current DAC may vary (increase or decrease) depending on circumstances (e.g., a change in the value of the control input, a change in the configuration of the reciprocal current DAC, etc.) and thus may be larger or less than the (desired) bias current.

Consequently, this difference would result in a change (increasing or decreasing) of the operating voltage of the reciprocal current DAC through the presence of the feedback circuit, in order to regulate the current back to the desired value.

In some embodiments, the reciprocal current DAC may comprise a plurality of first transistor devices and a second transistor device. In particular, the second transistor device may be coupled between a supply voltage (e.g., VDD) and the delay cell circuit. On the other hand, each one of the plurality of first transistor devices is selectively switchable to be coupled between the supply voltage and the bias circuit and to have a common gate with the second transistor device. The term "common gate" generally means that the respective gates of the selected number of first transistor devices and the gate of the second transistor devices are (directly) connected together. As such, a configurable number of first transistor devices can be selected to be coupled between the supply voltage and the bias circuit. In some cases, the plurality of first transistor devices may be coupled in parallel with each other. However, other suitable interconnections among the plurality of first transistor devices may be applied (used) as will be appreciated by the skilled person, as long as each one of the plurality of first transistor devices can be selectively switchable to be coupled between the supply voltage and the bias circuit and to have a common gate with the second transistor device.

In some embodiments, the method may further comprise a step of determining the configurable number of first transistor devices based on the value of the control input. In other words, depending on a particular value of the control input (for generating a corresponding particular delay), the method may determine a corresponding particular configurable number of the first transistor devices that can be selected (enabled) to be coupled between the supply voltage and the bias circuit.

In some embodiments, the method may further comprise a step of supplying the operating voltage generated by the feedback circuit to the common gate of the selected (configurable) number of first transistor devices and the second transistor device.

In some embodiments, the reciprocal current DAC may further comprise a third transistor device coupled in parallel with the plurality of first transistor devices between the supply voltage and the bias circuit. In particular, the third transistor device may also share the common gate with the configurable number of first transistor devices and the second transistor device. That is to say, the gate of the third transistor device may be connected to the common gate of the configurable number of first transistor devices and the second transistor device.

In some embodiments, the delay cell circuit may comprise a capacitive element. The capacitive element may be implemented as simple as a capacitor or as any other suitable element, as will be appreciated by the skilled person. The capacitive element may be coupled between the reciprocal current DAC and a predetermined voltage level. The predetermined voltage level may for example be VSS, ground (GND) or any other suitable reference voltage level. Configured as such, the capacitive element can be charged by the charge current, for generating a charge voltage at an intermediate node based on a charge of the capacitive element. The delay cell circuit may further comprise a comparator coupled to the intermediate node. The comparator may be used for generating the delayed digital output signal based on a comparison between the charge voltage and a reference voltage.

In some embodiments, the delay cell circuit may further comprise a switch arrangement (with one or more switching devices). The switch arrangement may be configured to couple the capacitive element to the charge current upon a rising flank (rising edge) or a falling flank (falling edge) of the input digital signal. That is to say, depending on the configuration of the switching arrangement, the rising edge or the falling edge (or even both edges in some cases) can be delayed as desired.

In some embodiments, the switch arrangement may comprise a first switching device and a second switching device. In particular, the first switching device may be coupled between the reciprocal current DAC and the intermediate node. The first switching device may be used for coupling the capacitive element to the charge current during an ON state (conductive state) of the first switching device. In this case, the capacitive element may be charged by the charge current and correspondingly generate the charge voltage at the intermediated node. As will be appreciated by the skilled person, the value of the charge voltage may vary (increase) and is dependent on the charging process of the capacitive element. On the other hand, the second switching device may be coupled in parallel with the capacitive element between the intermediate node and the predetermined voltage level. The second switching device may be used for decoupling the capacitive element from the charge current during an ON state of the second switching device. In this case, the capacitive element may be (gradually) discharged to zero. In order to properly charge and discharge the capacitive element for generating the delayed output digital signal, the method may further comprise a step of switching the first and second switching devices to the respective ON state in a mutually exclusive (complementary) manner based on the input digital signal. That is to say, depending on the value (amplitude) of the input digital signal, only one of the first switching device and the second switching is in the ON state and the other is in an OFF state (non-conductive state).

In some embodiments, the switch arrangement may further comprise a third switching device coupled between the reciprocal current DAC and the predetermined voltage level. In particular, the third switching device may be switched to its ON state in conjunction with the second switching device. In other words, the third switching device may be switched to the ON state at the same time as the second switching device, complementary to that of the first switching device.

In some embodiments, the method may further comprise a step of generating the bias current based on the same reference voltage as used by the delay cell circuit. That is to say, the same reference voltage used in the delay cell circuit (e.g., in the comparator of the delay cell) may be used also for the generation of the bias circuit. Configured as such, the delay may be generated in a way that is independent of the variation in the reference voltage. In particular, the feedback circuit (or the amplification circuit of the feedback circuit) may sense the output of the bias circuit and adjust (control) the reciprocal current DAC in accordance with the variations in the reference voltage.

In some embodiments, the bias circuit may comprise a fourth transistor device. The fourth transistor device may be controlled by a reference voltage. In particular, the same reference voltage used in the delay cell circuit may be used to operate (control) the fourth switching device of the bias circuit. Configured as such, the delay may be generated in a way that is independent of the variation in the reference voltage.

In some embodiments, all of the above mentioned transistor devices (i.e., the first through the fourth transistor devices) may be of the same transistor type. That is to say, the transistor devices may be implemented using the same type of transistors (e.g., NPN or PNP transistors). Configured as such, the delay may be generated in a way that is independent of the variation in the process (in the implementation of the transistors).

Similarly, in order to generate a delay in a way that is independent of the variation in the temperature, the charge current may be chosen to have a zero temperature coefficient.

Configured as such, the method for delay generation may be implemented to be independent of process, voltage and temperature (PVT).

The details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

Other and further embodiments of the present disclosure will become apparent during the course of the following discussion and by reference to the accompanying drawings.

BRIEF DESCRIPTION OF THE DRAWINGS

Example embodiments of the disclosure are explained below with reference to the accompanying drawings, wherein like reference numbers indicate like or similar elements, and wherein.

DETAILED DESCRIPTION

As indicated above, identical or like reference numbers in the disclosure indicate identical or like elements, and repeated description thereof may be omitted for reasons of conciseness. Any switching devices mentioned in this disclosure may be transistor devices, such as MOSFETs. In some figures the switching devices may be simplified, but they should be understood as the same or similar switching devices as shown in other figures.

Figure 1:
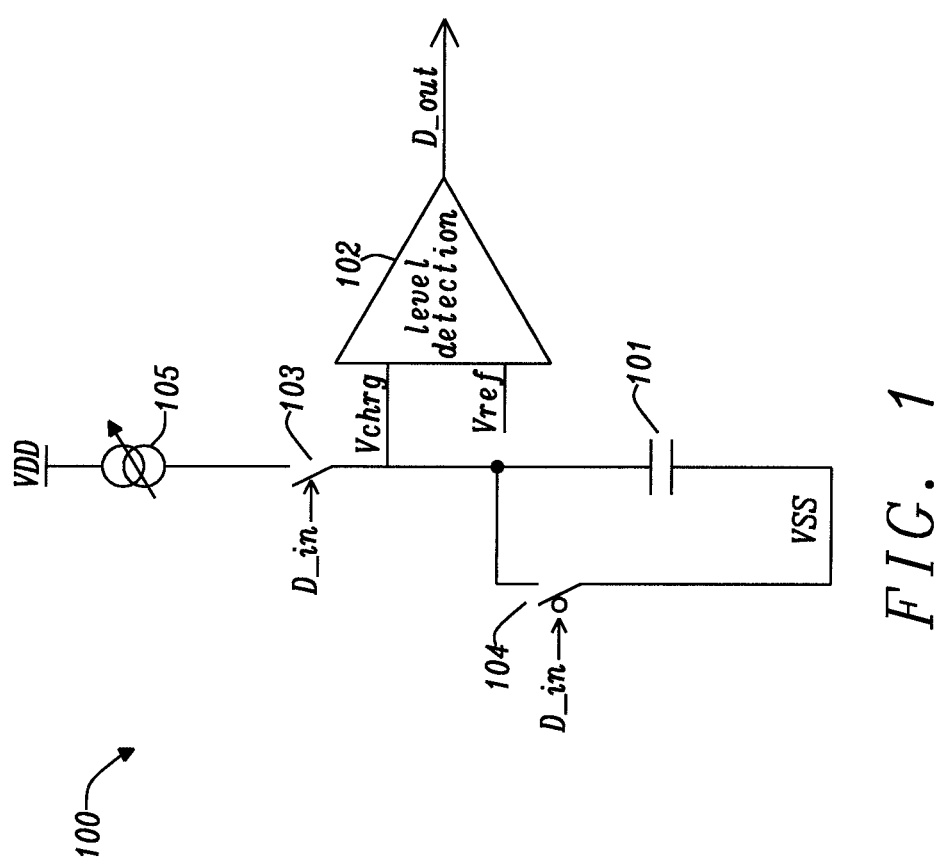
FIG. 1 schematically illustrates an example of an implementation of a delay cell.

FIG. 1 schematically illustrates an example of a delay cell circuit 100. Such delay cell circuit may also be simply referred to as a delay cell. In particular, the delay cell 100 comprises a capacitive element 101 and a level detection circuit 102. As will be appreciated by the skilled person, the capacitive element 101 may be implemented as simple as a capacitor or as any other suitable element. Similarly, the level detection circuit 102 may be implemented as simple as a comparator or as any other suitable circuit. The delay cell 100 further comprises a first switching device 103 and a second switching device 104. The first switching device 103 and the capacitive element 101 are coupled is (connected) in series between a supply voltage VDD and a predetermined voltage level. The predetermined voltage level may for example be VSS, ground (GND) or any other suitable reference voltage level. More particularly, the delay cell 100 yet further comprises a current source 105 coupled between the supple voltage VDD and the first switching device 103, such that the capacitive element 101 can be charged by a charge current from the current source 105 when the first switching device 103 is closed (i.e., in the ON state or the conductive state). Configured as such, the capacitive element 101 may be charged by the charge current and correspondingly generate a charge voltage at an intermediated node that is arranged between the first switching element 103 and one terminal of the capacitive element 101 (different from the terminal that is connected to the predetermined voltage level VSS). As will be appreciated by the skilled person, the value of the charge voltage may vary (increase) and is dependent on the charging process of the capacitive element 101. On the other hand, the second switching device 104 is coupled in parallel with the capacitive element 101 between the intermediate node and the predetermined voltage level VSS. The second switching device 104 is used for decoupling the capacitive element 101 from the current source 105 during the ON state of the second switching device 104. In this case, the capacitive element is (gradually) discharged to zero (ground).

In order to generate a signal delay, a digital input signal D_in is provided and used for controlling (operating) the first switching device 103 and the second switching device 104. For example, if the first and second switching devices 103 and 104 are implemented as MOSFETs, then the digital input signal D_in may be provided/supplied to the gate terminals (in general, control terminals) of the MOSFETs. Since the input signal D_in is a digital signal, a high value ("1") of the digital input signal D_in applied at the gate terminal may generally mean that the respective switching device is put in the ON state, while a low value ("0") of the digital input signal D_in applied at the gate terminal may generally mean that the respective switching device is put in an OFF state (non-conductive state). As will be understood and appreciated by the skilled person, the off time for the digital input signal (i.e., the duration of digital input signal remaining in the low value) may need to be long enough in order to discharge the capacitive element 101 completely to ground.

In particular, as can also be seen from FIG. 1, in order to properly charge and discharge the capacitive element 101, the first switching device 103 and second switching device 104 are switched to the respective ON state in a mutually exclusive (complementary) manner based on the input digital signal. That is to say, depending on the value (amplitude) of the digital input signal D_in, only one of the first switching device 103 and the second switching 104 is in the ON state and the other is in the OFF state.

Configured as such, a (varying) charge voltage can be generated at the intermediate node. The charge voltage is supplied to one input terminal of the comparator 102. The other input terminal of the comparator 102 is provided with a suitable reference voltage. Consequently, depending on the toggle (e.g., from low to high, or from high to low) of the comparator 102 (based on a comparison of the charge voltage and the reference voltage), a delayed digital output signal D_out is generated.

In the delay cell implementation 100 of FIG. 1, only the rising edge (rising flank) of the digital input signal D_in is delay. However, as will be understood and appreciated by the skilled person, different variations of the delay cell circuit can be implemented and also the falling edge (or both the rising and falling edges) can be delayed as desired. For example, the placements of the current source 105 and the capacitive element 101 may be swapped, i.e., the current source 105 may be placed at the low side and the capacitive element 101 may be placed at the high side. Broadly speaking, the delay time $T_{del}$ between the digital output signal D_out and the digital input signal D_in can be expressed as:

$$T_{del} = C \times \frac{Vref}{I}$$

where C is the capacitance of the capacitive element 101, Vref is the reference voltage supplied to the comparator 102 and I is the charge current supplied by the current source 105. Sometimes, an additional (constant) delay $T_{fixed}$ caused by finite parasitic capacitances and the delay of the comparator 102 may be considered. However, in some cases, such constant delay $T_{fixed}$ may be (temporarily) omitted for simplification reasons.

Generally speaking, as can be seen from the above equation, in order to tune the delay to the required value, it would be necessary to alter (at least) one of the three parameters, namely the capacitance of the capacitive element 101, the reference voltage of the comparator 102 and the charge current of the current source 105. Furthermore, in order to achieve a delay that is linear proportional to a control input (not shown in FIG. 1), it would be desired that the value of the to-be-tuned parameter can also be changed in a linear manner.

Figure 2:
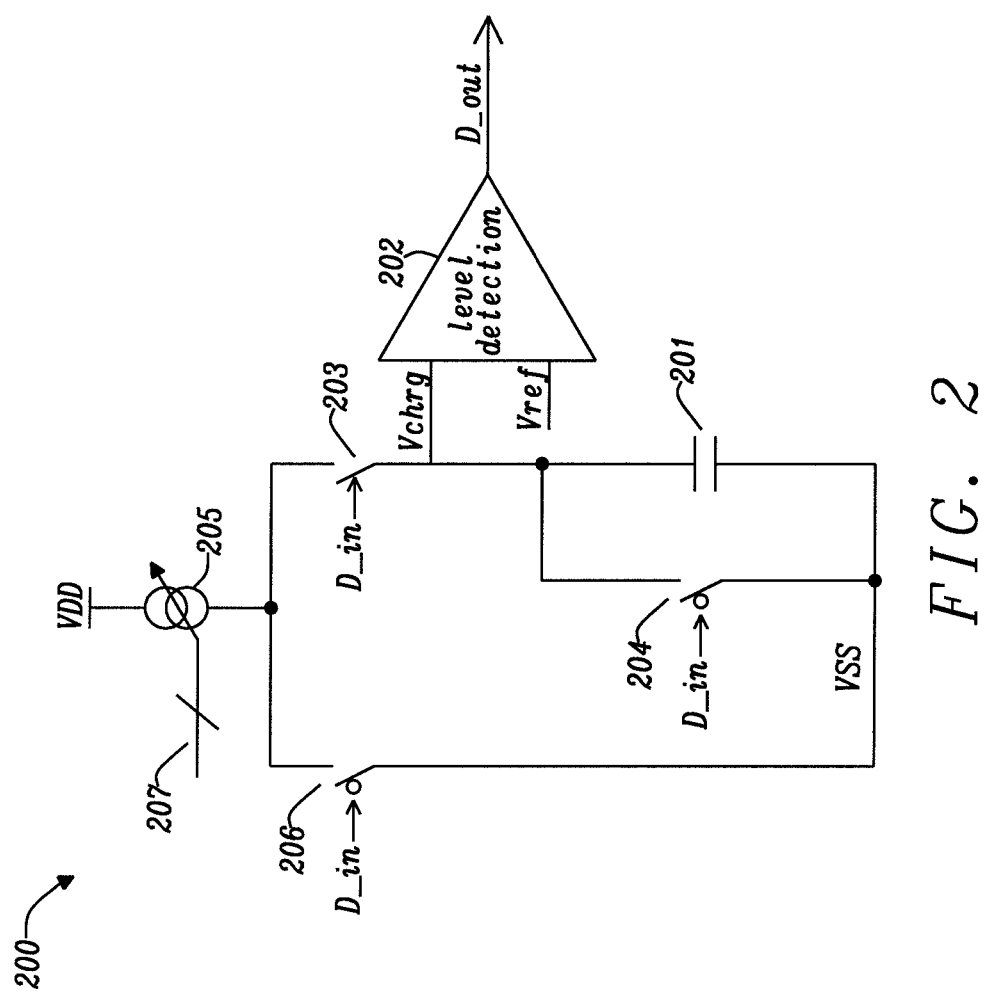
FIG. 2 schematically illustrates another example of an implementation of a delay cell.

FIG. 2 schematically illustrates another example of an implementation of a delay cell circuit 200. In particular, identical or like reference numbers in FIG. 2 indicate identical or like elements in the delay cell circuit 100 as shown in FIG. 1, such that repeated description thereof may be omitted for reasons of conciseness. In addition to the delay cell circuit 100 of FIG. 1, a third switching device 206 is also provided. The third switching device 206 is coupled between the current source 205 and the predetermined voltage level VSS. As can be seen from FIG. 2, the third switching device 206 is controlled (operated) by the digital input signal D_in in conjunction with the second switching device 204. That is to say, the third switching device 206 may be switched to the ON state at the same time as the second switching device 204, complementary to that of the first switching device 203. Arranged as such, the current source 205 can be coupled to the predetermined voltage level (VSS or GND) during the discharging phase of the capacitive element 201, thereby reducing (eliminating) the influence of the current source 205 to the delay generation.

Notably, in the delay cell circuit 200 of FIG. 2, the current source 205 is controlled by a control input 207. That is to say, depending on the value of the control input 207, a different charge current may be generated from the current source 205. The control input may in some cases be referred to as a (digital) control vector comprising for example N (input) bits, wherein N is an integer larger than or equal to 1. As will be understood and appreciated by the skilled person, the number N may be chosen (determined) depending on different circumstances and/or requirements, such as the maximum delay required, etc. By way of example, if N equals to 8 (i.e., an 8-bit control vector), it means that the input value provided to the reciprocal current may be any one value from 0 (i.e., all 8 bits set to 0) to 255 (i.e., all 8 bits set to 1). Arranged as such, by vary the value of the control input 207, the generated delay time between the digital output signal D_out and the is digital input signal D_in can also be varied.

In order to generate a delay time $T_{del}$ which is linearly related to the value of the control vector, the charge current I has to change as a reciprocal function as follows:

$$I = 1/\text{delay}_{select}$$

where delay select denotes the value of the control vector.

Figure 3:
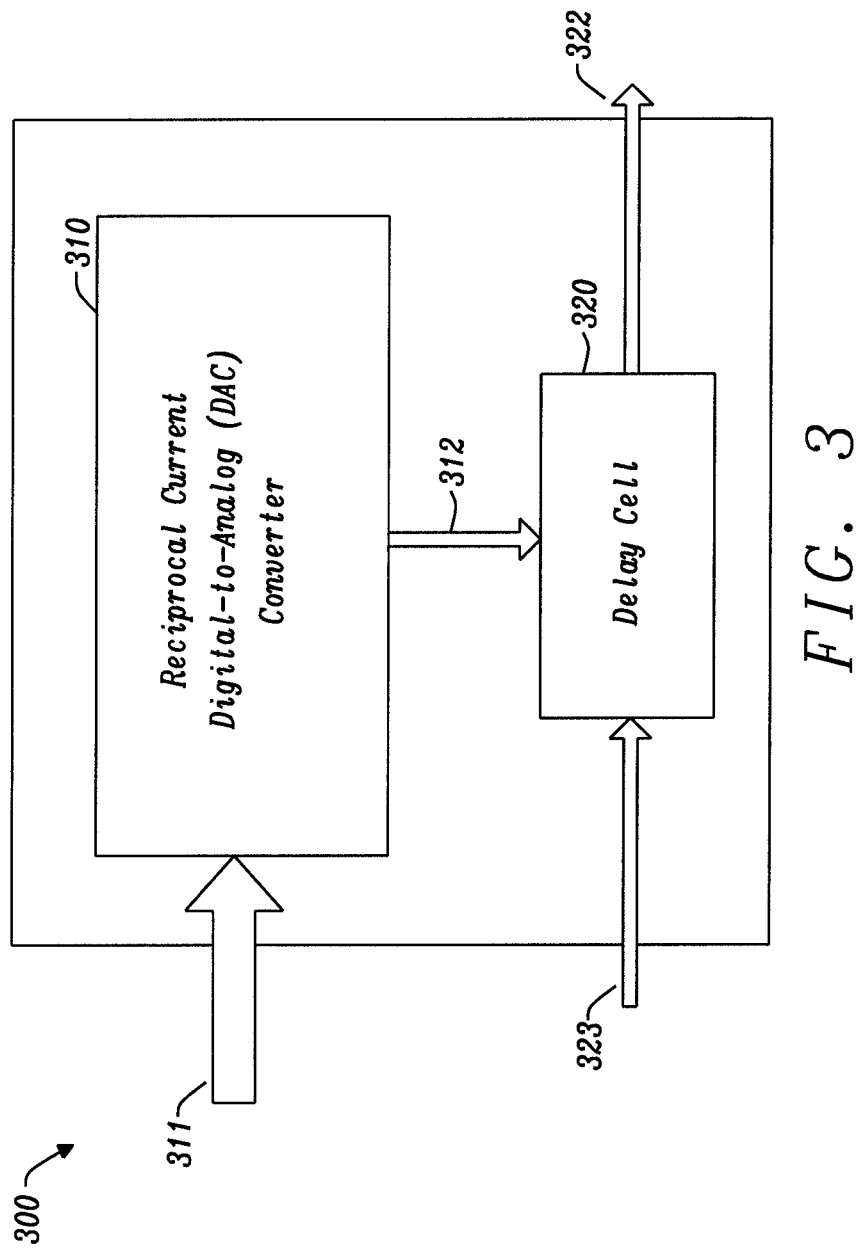
FIG. 3 schematically illustrates a block diagram of a circuitry for delaying a digital input signal according to an embodiment of the present disclosure.

FIG. 3 schematically illustrates a block diagram of a circuitry 300 for delaying a digital input signal according to an embodiment of the present disclosure. The circuitry 300 comprises a reciprocal current DAC 310 and a delay cell 320 coupled together. The delay cell may for example be implemented as the delay cell 100 of FIG. 1, the delay cell 200 of FIG. 2, or any other suitable manner, as will be appreciated by the skilled person. On the other hand, the reciprocal current DAC 310 is configured to output a charge current 312 to the delay cell circuit 320 according to a value of a control input 311 provided to the reciprocal current DAC 310. The control input (vector) 311 may for example be the same control vector 207 as shown in FIG. 2. The delay cell 320 is then configured to generate a delayed digital output signal 322 of the digital input signal 321 based on the charge current 312 generated by the reciprocal current DAC 310. By introducing the reciprocal current DAC 310, the generated charge current 312 has a reciprocal (inversely proportional) function with respect to the control vector 311, as illustrated in the above equation. Configured as such, a delay time (between the digital output signal 322 and the digital input signal 321) that changes linearly proportional to the control vector can be generated.

Figure 4:
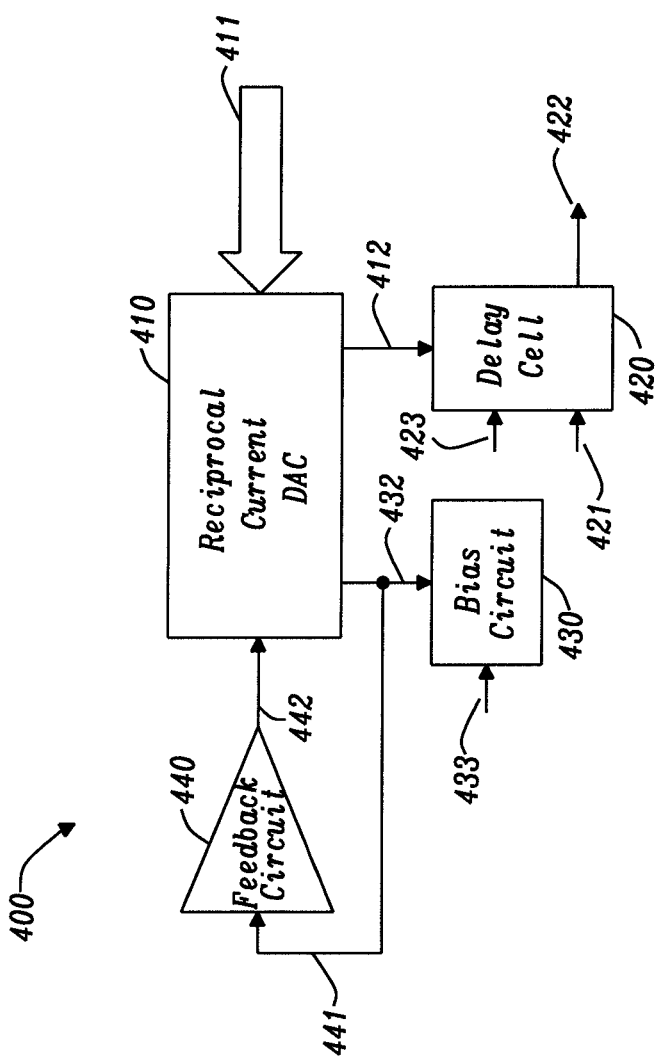
FIG. 4 schematically illustrates a block diagram of a circuitry for delaying a digital input signal according to another embodiment of the present disclosure.

FIG. 4 schematically illustrates a block diagram of a circuitry 400 for delaying a digital input signal according to another embodiment of the present disclosure. In particular, identical or like reference numbers in FIG. 4 indicate identical or like elements in the circuitry 300 as shown in FIG. 3, such that repeated description thereof may be omitted for reasons of conciseness.

In addition to the circuitry 300 of FIG. 3, a bias circuit 430 and a feedback circuit 440 are also provided. In particular, the bias circuit 430 is coupled to the reciprocal current DAC 410, for generating a bias current 432 for the reciprocal current DAC. As will be appreciated by the skilled person, in some cases, the generated bias current 432 may be understood as a current that the bias circuit 430 would like to drain (sink) from the reciprocal current DAC 410 to the bias circuit 430. The feedback circuit 440 is coupled to the bias circuit 430 and to the reciprocal current DAC 410. The feedback circuit is used for generating an operating voltage 442 based on the bias current 432. In particular, the operating voltage 442 is used for controlling (operating) the reciprocal current DAC 410. As will be appreciated by the skilled person, the feedback circuit may be implemented as a feedback loop coupled between an output of the reciprocal current DAC 410 and an input of the reciprocal current DAC 410. In some cases, the feedback circuit 440 may comprise an amplification circuit. The amplification circuit may be used for generating the operating voltage that is used for controlling (operating) the reciprocal current DAC 410. In some cases, the amplification circuit may be implemented as simple as an amplifier. However, other suitable implementations of the amplification circuit may also be applied, as will be appreciated by the skilled person. Notably, the feedback circuit 440 is chosen such that the output charge current from the reciprocal current DAC 410 is immune to power supply variation. Thus, the bias current 432 for the DAC 410 can be constant for given PVT and be only a function of the reference voltage.

In some cases, the generation of the operating voltage 442 can comprise (a step of) comparing the bias current 432 to a current that depends on the charge current 412. Correspondingly, the operating voltage may be generated based on a result of the comparison. The result of the comparison may be supplied to the feedback circuit 440 as an input 441. As will be understood and appreciated by the skilled person, the (actual) current drained from the reciprocal current DAC 410 may vary (increase or decrease) depending on circumstances (e.g., a change in the value of the control input 411, a change in the configuration of the reciprocal current DAC 410, etc.) and thus may be larger or less than the bias current 432. Consequently, this difference there between would result in a change (increasing or decreasing) of the operating voltage 442 of the reciprocal current DAC 410 through the presence of the feedback circuit 440, in order to regulate the current back to the desired value.

As can be further seen from FIG. 4, the delay cell 420 and the bias circuit 430 both have a respective reference input voltage 423 and 433. In particular, the reference input 423 of the delay cell 420 and the reference input 433 of the bias circuit 430 may be have the same reference voltage. Configured as such, the generated delay can be made independent of any variation in the reference input due to PVT. The feedback circuit 440 then senses the output 432 of the bias circuit 430 and adjusts the reciprocal current DAC 410 accordingly due to variations in the reference voltage. Notably, in some cases, the bias current may be generated by forcing the reference voltage across a zero temperature coefficient resistor, so as to track the threshold of the comparator of the delay cell. Alternately in some other cases, the bias current could be a fixed bias, which could be trimmed for process variation.

Figure 5:
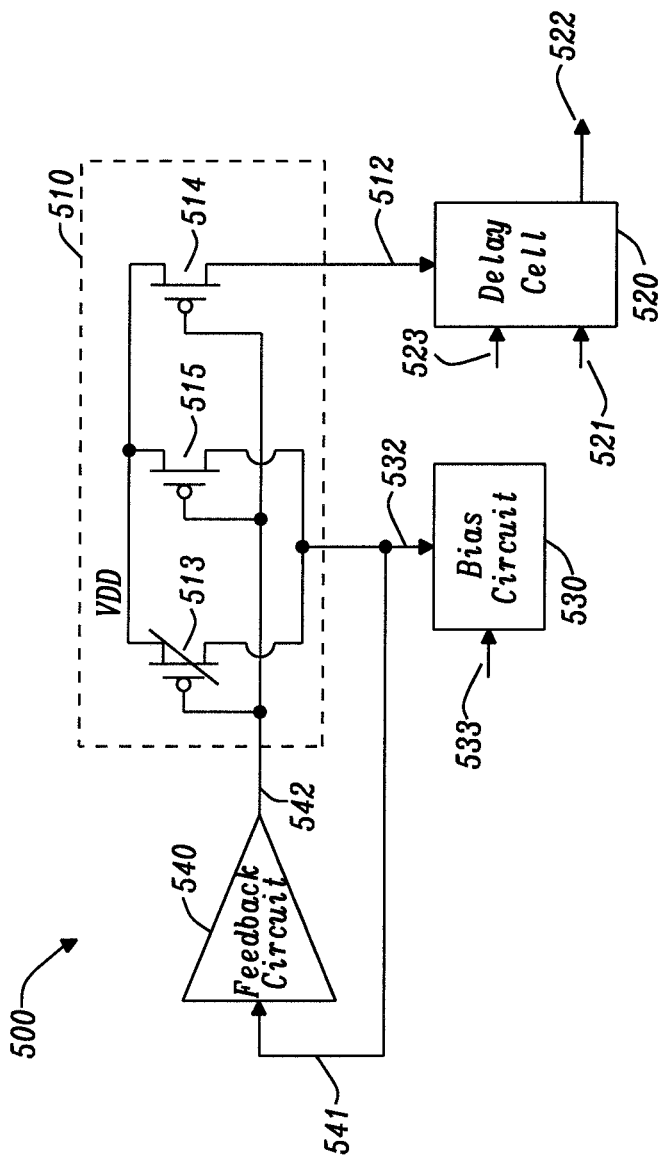
FIG. 5 schematically illustrates a block diagram of a circuitry for delaying a digital input signal according to yet another embodiment of the present disclosure.

FIG. 5 schematically illustrates a block diagram of another circuitry 500 for delaying a digital input signal according to yet another embodiment of the present disclosure. In particular, identical or like reference numbers in FIG. 5 indicate identical or like elements in the circuitry 400 as shown in FIG. 4, such that repeated description thereof may be omitted for reasons of conciseness.

In comparison to the circuitry 400 of FIG. 4, the reciprocal current DAC 510 comprises a plurality of first transistor devices 513 and a second transistor device 514. In particular, the second transistor device 514 is coupled between the supply voltage VDD and the delay cell circuit 520. On the other hand, each one of the plurality of first transistor devices 513 is selectively switchable to be coupled between the supply voltage VDD and the bias circuit 530 and to have a common gate with the second transistor device 514. The term "common gate" generally means that the respective gates of the selected number of first transistor devices and the gate of the second transistor devices are connected together. As such, a configurable number of first transistor devices 513 can be selected to be coupled between the supply voltage VDD and the bias circuit 530. In some cases, the plurality of first transistor devices 513 may be coupled in parallel with each other. However, other suitable interconnections among the plurality of first transistor devices 513 may be used, as long as each one of the plurality of first transistor devices 513 can be selectively switchable to be coupled between the supply voltage VDD and the is bias circuit 530 and to have a common gate with the second transistor device 514. The operating voltage 542 generated by the feedback circuit 540 can then be supplied to the common gate of the selected (configurable) number of first transistor devices 513 and the second transistor device 514.

The configurable number of first transistor devices 513 can be determined based on the value of the control input (e.g., the control vector 411 of FIG. 4, not shown in FIG. 5). In other words, depending on a particular value of the control input (for generating a corresponding particular delay), a corresponding particular configurable number of the first transistor devices 513 can be selected (enabled) to be coupled between the supply voltage VDD and the bias circuit 530.

Optionally (but not mandatory), the reciprocal current DAC 510 may further comprise a third transistor device 515 coupled in parallel with the plurality of first transistor devices 513 between the supply voltage VDD and the bias circuit 530. In particular, the third transistor device 515 may have the same multiplicity as the second transistor device 514. In some cases, in order to compensate for the parasitic capacitances and delays, the second transistor device 514 could have a higher multiplicity compared to that of the third transistor device 515. The third transistor device 515 may also share the common gate with the configurable number of first transistor devices 513 and the second transistor device 514. That is to say, the gate of the third transistor device 515 may be connected to the common gate of the configurable number of first transistor devices 513 and the second transistor device 514.

In particular, the feedback circuit 540 makes sure that the sum of the current from the configurable number of first transistor devices 513 (and optionally the current from the third transistor device 515 if available) is equal to the bias current 532 for the reciprocal current DAC 510. As illustrated above, the number of first transistor devices are changed (configured) according to the control vector, in order to change the delay accordingly. Consequently, the sum of the currents supplied by the configurable number of first transistor devices 513 (and optionally the current from the third transistor device 515 if available) may become larger or smaller than the bias current 532 for the reciprocal current DAC 510. The result is an increase or decrease in the voltage (or current) 541 at the input node of the feedback circuit 540. Correspondingly, the feedback circuit 540 then increases or decreases the gate voltage for the plurality of first transistor device 513, the second transistor device 514 and optionally the third transistor device 515 if available, in order to regulate the output back to its original desired value via the feedback loop.

Notably, in some examples, the bias circuit 530 (also the bias circuit 430 of FIG. 4) may comprise a fourth transistor device (not shown in FIG. 5). The fourth transistor device may be controlled by reference voltage 533. As illustrated above, the same reference voltage 523 used in the delay cell circuit can be used to operate (control) the fourth switching device of the bias circuit 530. Configured as such, the delay may be generated in a way that is independent of the variation in the reference voltage. In particular, all of the above mentioned transistor devices (i.e., the first through the fourth transistor devices) may be of the same transistor type. That is to say, the transistor devices may be implemented using the same type of transistors (e.g., NPN or PNP transistors). Configured as such, the delay may be generated in a way that is independent of the variations in the process (in the implementation of the transistors). Similarly, in order to generate a delay in a way that is independent of the variations in the temperature, the bias circuit 530 may be configured to generate a current, which is independent of temperature. Configured as such, the circuitry for delay generation may be implemented to be PVT independent.

In the circuitry 500 as shown in FIG. 5, the delay time $T_{del}$ between the digital output signal and the digital input signal can be calculated according to the following equations:

$$Iunit = \frac{Ibias}{P\_3 + P\_1[N:1]}$$

$$T_{del} = \frac{Vref \times C}{Iunit \times P\_2}$$

$$T_{del} = \frac{Vref \times C \times (P\_3 + P\_1[N:1])}{Ibias \times P\_2}$$

where Ibias is the bias current 532 generated by the bias circuit 530, P_1[N: 1] represents the configurable number of the first transistor devices 513 based on the N-bit input control vector, P_2 represents the second transistor device 514, P_3 represents the third transistor device 515, and Iunit represents the unit current caused by the configurable number of the first transistor devices 513 and the (optional) third transistor device 515 based on the N-bit input control vector.

As can be seen from the above equations, as the configurable number of the first transistor devices 513 changes based on the value of the N-bit control vector (i.e., from 0 to $2^N-1$), the quantity $T_{del}$ also changes linearly accordingly, which implies that the is charge current has a reciprocal function for $T_{del}$ (at least) in the range when the configurable number of the first transistor devices 513 changes from 0 to N−1.

Figure 6A:
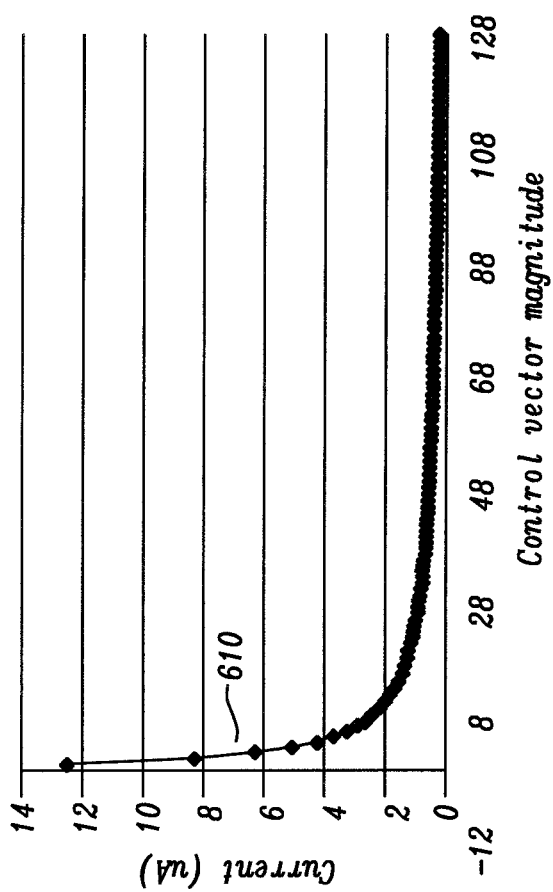
FIG. 6A schematically illustrates an example of a simulation result of the delay cell current versus the control vector magnitude.
Figure 6B:
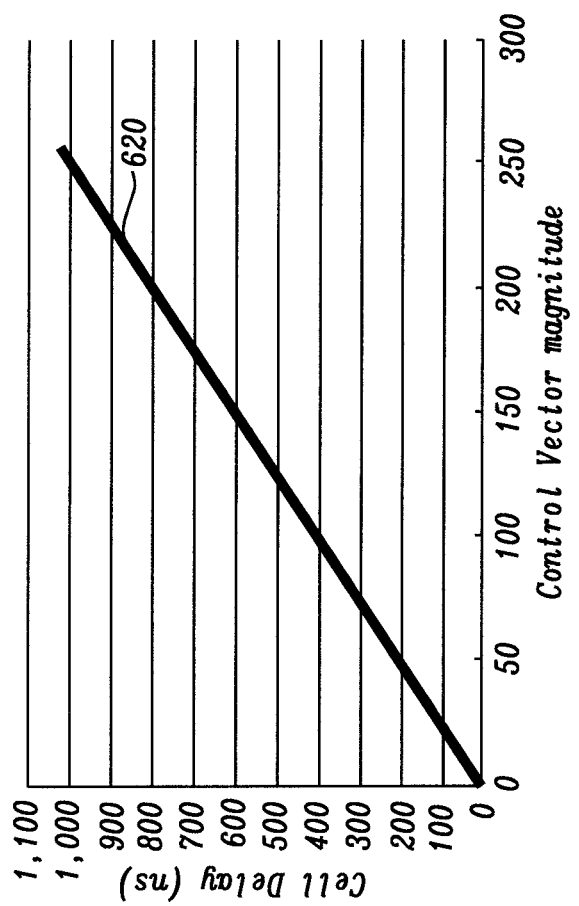
FIG. 6B schematically illustrates another example of a simulation result of the generated delay versus the control vector magnitude.

FIGS. 6A and 6B schematically illustrates simulation results of the circuitry 500 of FIG. 5. In particular, FIG. 6A shows the simulation result of the charge current versus the control vector magnitude. As can be seen from curve 610 of FIG. 6A, when the magnitude (value) of the control vector increases (e.g., sweeps from 0 to 127 as shown in the x-axis), the charge current reduces in an inversely proportional (reciprocal) manner (as shown in the y-axis). FIG. 6B shows the simulation result of the generated delay versus the control vector magnitude. As can be seen from curve 620 of FIG. 6B, when the magnitude (value) of the control vector increases (e.g., sweeps from 0 to 255 as shown in the x-axis), the generated delay also increases in a linearly proportional manner (as shown in the y-axis).

Figure 7:
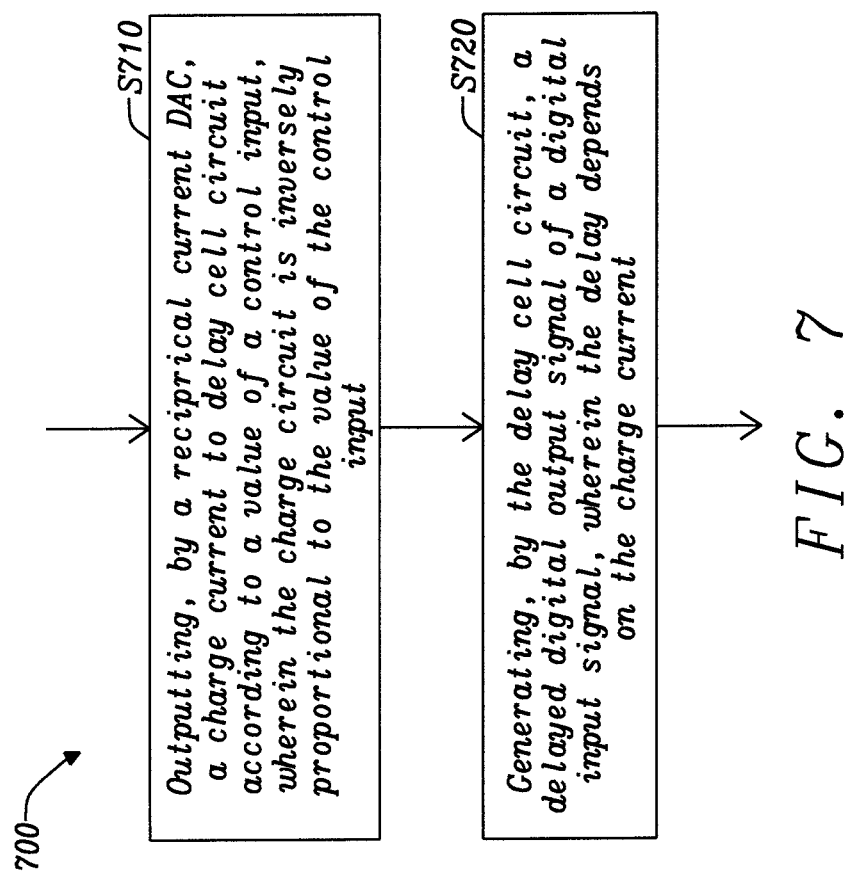
FIG. 7 schematically illustrates, in flowchart form, a method for delaying a digital input signal of a circuitry according to an embodiment of the present disclosure.

FIG. 7 schematically illustrates a flowchart of a method 700 for delaying a digital input signal of a circuitry according to an embodiment of the present disclosure. The circuitry may correspond to any one of the circuitry 300, 400 and 500 as shown in FIGS. 3 to 5, respectively. Therefore, repeated description for the circuitry thereof may be omitted for reasons of conciseness. In particular, the method 700 comprises, at step S710, outputting, by a reciprocal current DAC (e.g., the reciprocal current DAC 310 of FIG. 3), a charge current to a delay cell circuit (e.g., the delay cell 320 of FIG. 3) according to a value of a control input (e.g., the control vector 311 of FIG. 3). The charge current is inversely proportional to the value of the control input. The method 700 further comprises, at step S720, generating, by the delay cell circuit, a delayed digital output (e.g., the digital output signal 322 of FIG. 3) signal of the digital input signal (e.g., the digital input signal 321 of FIG. 3). The generated delay depends on the charge current generated by the reciprocal current DAC.

It should be noted that the apparatus (circuitry) features described above correspond to respective method features that may however not be explicitly described, for reasons of conciseness. The disclosure of the present document is considered to extend also to such method features. In particular, the present disclosure is understood to relate to methods of operating the circuits described above, and/or to providing and/or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuitry for delaying a digital input signal, the circuitry comprising:
a delay cell circuit; and
a reciprocal current digital-to-analog converter, DAC, coupled to the delay cell circuit,
wherein the reciprocal current DAC is configured to output a charge current to the delay cell circuit according to a value of a control input;
wherein the charge current is inversely proportional to the value of the control input;
wherein the delay cell circuit is configured to generate a delayed digital output signal of the digital input signal; and
wherein the delay depends on the charge current.

2. The circuitry according to claim 1, wherein the circuitry further comprises:

a bias circuit coupled to the reciprocal current DAC, for generating a bias current for the reciprocal current DAC; and
a feedback circuit coupled to the bias circuit, for generating an operating voltage based on the bias current, wherein the operating voltage is used for controlling the reciprocal current DAC.

3. The circuitry according to claim 2, wherein the feedback circuit comprises an amplification circuit for generating the operating voltage that is used for controlling the reciprocal current DAC.

4. The circuitry according to claim 2, wherein generating the operating voltage comprises comparing the bias current to a current that depends on the charge current and generating the operating voltage based on a result of the comparison.

5. The circuitry according to claim 2, wherein the reciprocal current DAC comprises a plurality of first transistor devices and a second transistor device;
wherein each of the plurality of first transistor devices is selectively switchable to be coupled between a supply voltage and the bias circuit and to have a common gate with the second transistor device, so that a configurable number of first transistor devices can be selected to be coupled between the supply voltage and the bias circuit; and
wherein the second transistor device is coupled between the supply voltage and the delay cell circuit.

6. The circuitry according to claim 5, wherein the configurable number of first transistor devices is determined based on the value of the control input.

7. The circuitry according to claim 5, wherein the operating voltage generated by the feedback circuit is supplied to the common gate.

8. The circuitry according to claim 5, wherein the reciprocal current DAC further comprises a third transistor device coupled in parallel with the plurality of first transistor devices between the supply voltage and the bias circuit; and
wherein the third transistor device shares the common gate with the configurable number of first transistor devices and the second transistor device.

9. The circuitry according to claim 1, wherein the delay cell circuit comprises:
a capacitive element coupled between the reciprocal current DAC and a predetermined voltage level that can be charged by the charge current, for generating
a charge voltage at an intermediate node based on a charge of the capacitive element; and
a comparator coupled to the intermediate node, for generating the delayed digital output signal based on a comparison between the charge voltage and a reference voltage.

10. The circuitry according to claim 9, wherein the delay cell circuit further comprises a switch arrangement configured to couple the capacitive element to the charge current upon a rising flank or a falling flank of the input digital signal.

11. The circuitry according to claim 10, wherein the switch arrangement comprises:
a first switching device coupled between the reciprocal current DAC and the intermediate node, for coupling the capacitive element to the charge current during an ON state of the first switching device; and
a second switching device coupled in parallel with the capacitive element between the intermediate node and the predetermined voltage level, for decoupling the capacitive element from the charge current during an ON state of the second switching device, and wherein the first and second switching devices are switched to the ON state in a mutually exclusive manner based on the input digital signal.

12. The circuitry according to claim 11, wherein the switch arrangement further comprises:

a third switching device coupled between the reciprocal current DAC and the predetermined voltage level; and wherein the third switching device is switched to the ON state in conjunction with the second switching device.

13. The circuitry according to claim 2, wherein the bias current is generated based on a same reference voltage as used by the delay cell circuit.

14. The circuitry according to claim 5, wherein the bias circuit comprises a fourth transistor device controlled by a reference voltage.

15. The circuitry according to claim 5, wherein all transistor devices are of the same transistor type.

16. A method for delaying a digital input signal of a circuitry, wherein the circuitry comprises:

a delay cell circuit; and a reciprocal current digital-to-analog converter, DAC, coupled to the delay cell circuit, and wherein the method comprises:

outputting, by the reciprocal current DAC, a charge current to the delay cell circuit according to a value of a control input, wherein the charge current is inversely proportional to the value of the control input; and generating, by the delay cell circuit, a delayed digital output signal of the digital input signal, wherein the delay depends on the charge current.

17. The method according to claim 16, wherein the circuitry further comprises:

a bias circuit coupled to the reciprocal current DAC; and a feedback circuit coupled to the bias circuit, and wherein the method further comprises:

generating, by the bias circuit, a bias current for the reciprocal current DAC;

generated an operating voltage based on the bias current; and controlling the reciprocal current DAC using the operating voltage.

18. The method according to claim 17, wherein the feedback circuit comprises an amplification circuit for generating the operating voltage used for controlling the reciprocal current DAC.

19. The method according to claim 17, wherein generating the operating voltage comprises comparing the bias current to a current that depends on the charge current and generating the operating voltage based on a result of the comparison.

20. The method according to claim 17, wherein the reciprocal current DAC comprises a plurality of first transistor devices and a second transistor device;

wherein each of the plurality of first transistor devices is selectively switchable to be coupled between a supply voltage and the bias circuit and to have a common gate with the second transistor device, so that a configurable number of first transistor devices can be selected to be coupled between the supply voltage and the bias circuit; and wherein the second transistor device is coupled between the supply voltage and the delay cell circuit.

21. The method according to claim 20, wherein the method further comprises determining the configurable number of first transistor devices based on the value of the control input.

22. The method according to claim 20, wherein the method further comprises supplying the operating voltage generated by the feedback circuit to the common gate.

23. The method according to claim 20, wherein the reciprocal current DAC further comprises a third transistor device coupled in parallel with the plurality of first transistor devices between the supply voltage and the bias circuit; and wherein the third transistor device shares the common gate with the configurable number of first transistor devices and the second transistor device.

24. The method according to claim 16, wherein the delay cell circuit comprises:

a capacitive element coupled between the reciprocal current DAC and a predetermined voltage level that can be charged by the charge current, for generating a charge voltage at an intermediate node based on charge of the capacitive element; and a comparator coupled to the intermediate node, for generating the delayed digital output signal based on a comparison between the charge voltage and a reference voltage.

25. The method according to claim 24, wherein the delay cell circuit further comprises a switch arrangement configured to couple the capacitive element to the charge current upon rising or falling flank of the input digital signal.

26. The method according to claim 25, wherein the switch arrangement comprises:

a first switching device coupled between the reciprocal current DAC and the intermediate node, for coupling the capacitive element to the charge current during an ON state of the first switching device; and a second switching device coupled in parallel with the capacitive element between the intermediate node and the predetermined voltage level, for decoupling the capacitive element from the charge current during an ON state of the second switching device, and wherein the method further comprises switching the first and second switching devices to the ON state in a mutually exclusive manner based on the input digital signal.

27. The method according to claim 26, wherein the switch arrangement further comprises:

a third switching device coupled between the reciprocal current DAC and the predetermined voltage level; and wherein the third switching device is switched to the ON state in conjunction with the second switching device.

28. The method according to claim 17, wherein the method further comprises generating the bias current based on a same reference voltage as used by the delay cell circuit.

29. The method according to claim 20, wherein the bias circuit comprises a fourth transistor device controlled by a reference voltage.

30. The method according to claim 20, wherein all transistor devices are of the same transistor type.

* * * * *